United States Patent [19]

Bell

[11] 3,887,911

[45] June 3, 1975

[54] DIGITAL-TO-ANALOGUE CONVERTER FOR RAPIDLY CONVERTING DIFFERENT CODES

[75] Inventor: Philip Richard Bell, Chelmsford, England

[73] Assignee: The Marconi Company Limited, Chelmsford, Essex, England

[22] Filed: Feb. 15, 1973

[21] Appl. No.: 332,548

[30] Foreign Application Priority Data

Feb. 24, 1972 United Kingdom................ 8562/72

[52] U.S. Cl....................... 340/347 DA; 179/15 AV

[51] Int. Cl............................................. H03k 13/02

[58] Field of Search...340/347 DA, 347 NT, 347 CC; 179/15 AV, 15 AE; 235/197

[56] References Cited

UNITED STATES PATENTS

| | | | |
|---|---|---|---|
| 3,305,857 | 2/1967 | Barber | 340/347 DA |
| 3,495,237 | 2/1970 | Le Corre et al. | 340/347 DA |
| 3,500,247 | 3/1970 | Sekimoto et al. | 340/347 AD X |
| 3,560,659 | 2/1971 | Greefkes et al. | 179/15 AV |
| 3,582,941 | 6/1971 | LeMaout et al. | 340/347 DA |
| 3,594,780 | 7/1971 | Greefkes et al. | 340/347 DA |
| 3,594,782 | 7/1971 | Carbrey | 340/347 DA |
| 3,603,981 | 9/1971 | Rollenhagen et al. | 340/347 DA |
| 3,626,408 | 12/1971 | Carbrey | 340/347 DA |
| 3,653,030 | 3/1972 | Carbrey | 340/347 DA |
| 3,653,035 | 3/1972 | Carbrey | 340/347 DA |
| 3,686,665 | 8/1972 | Elias et al. | 340/347 AD |
| 3,752,970 | 8/1973 | Aaron et al. | 179/15 AV X |

OTHER PUBLICATIONS

Harrison, "Logarithmic D/A Converter," IBM Technical Disclosure Bulletin, Vol. 5, No. 5, Oct. 1962, pp. 30, 31.

*Primary Examiner*—Thomas J. Sloyan
*Attorney, Agent, or Firm*—Baldwin, Wight & Brown

[57] ABSTRACT

A digital-to-analogue converter of the kind which provides a segmented digital-to-analogue transfer characteristic is capable of converting a digital signal to its corresponding analogue signal more quickly than known comparable converters. A linearly increasing signal is arranged to increase constantly at a rate corresponding to the slope of that portion of the segmented transfer characteristic on which the desired analogue value lies.

3 Claims, 5 Drawing Figures

DIGITAL-TO-ANALOGUE CONVERTER FOR RAPIDLY CONVERTING DIFFERENT CODES

This invention relates to digital-to-analogue converters and particularly, but not exclusively, to digital-analogue converters for decoding data transmitted in pulse code modulation (P.C.M.) form.

Figure 1:
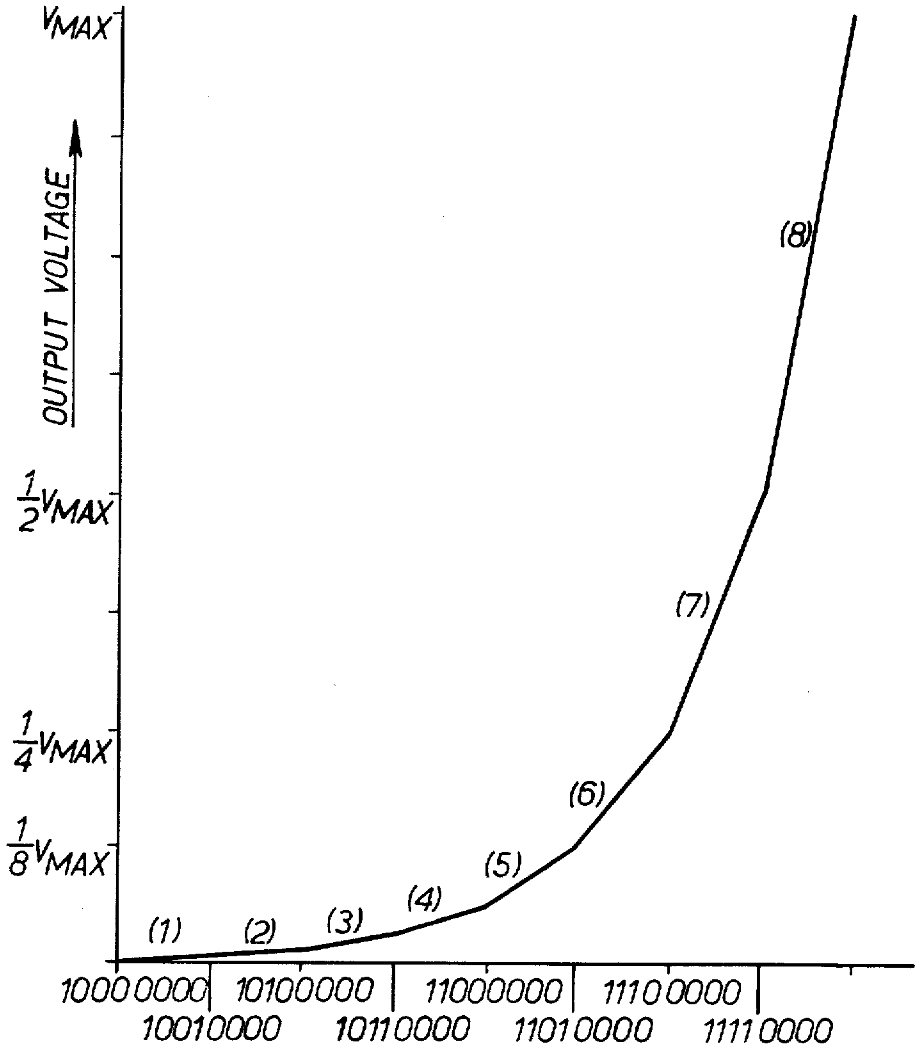

As is well known, because of the digital nature in which information is applied to a digital-to-analogue converter the decoded analogue signal inevitably includes, to a greater or lesser extent, what is usually termed quantisation noise resulting from the fact that only particular discrete signal levels can be produced from a representative digital signal. It is frequently arranged that a relatively greater number of digital codes are allocated to low amplitude analogue signals and a relatively fewer number of digital codes are allocated to higher amplitude analogue signals. In this way the effect of quantisation noise is reduced at low signal levels where the fidelity of reproduction is most important and most susceptable to distortion. It follows from this that the relationship between the different digital codes and the corresponding analogue signal amplitudes is not linear, but obeys what is usually termed a companding law. An example of a companding law which is often referred to as a segmented law is shown in FIG. 1 in which a plot of relative analogue signal amplitudes is shown against corresponding digital codes, the digital codes in this case being binary codes as is usual. Only positive values of the segmented law are illustrated, but the law includes the same curve rotated through 180° to appear in the third quadrant to include negative voltages.

One method of decoding digital signals of this kind uses a ramp or staircase generator the operation of which is initiated by a received pulse, and the operation of which is subsequently halted when its output is representative of the value of the digital code. Its output therefore passes through each possible value (in order of increasing value) until the correct value is reached. Since there are a great many digital codes this can be a time consuming task. Moreover, each decoding process is usually allocated a specific length of time for synchronisation purposes, and the resulting analogue signal is not sampled until this specific length of time has elapsed. Thus where the code has a low value it is necessary for the analogue signal to be held or otherwise stored at a constant value for a relatively long period of time. The time occupied by each decoding process also determines the maximum rate at which digital codes can be passed to the converter, and the present invention seeks to provide improved digital-to-analogue converters which shall be inherently capable of faster conversion than the above-described arrangements.

According to this invention a digital-to-analogue converter of the kind which obeys a segmented digital-to-analogue conversion law, the segmented law consisting of a number of joined straight-line segments, includes means for receiving a digital code which is to be converted to an analogue signal; means for examining said digital code to determine on which particular one of said straight-line segments the analogue signal will lie; means for generating a linearly increasing signal, and means for arranging that the rate of linear increase corresponds to the slope of the said particular one of the straight-line segments, the rate of increase being maintained constant until the desired analogue signal value is reached.

The linearly increasing signal may be represented by a staircase profile or a dotted straight-line ramp since the output has only a single value for a given code. Preferably the linearly increasing signal is represented by a straight-line ramp derived from the rise in voltage obtained by charging a capacitor from a constant current source.

Perferably the means for generating the said linearly increasing signal includes a plurality of constant-current generators, means for selectively energising the constant-current generators in dependence on which particular one of said segments the analogue signal will lie, and means for combining or selecting the currents provided by the selectively energised constant-current generators, the combined or selected current being used to charge said capacitor.

The capacitor may always be charged to voltages of the same polarity, in which case the voltage is subsequently inverted if an output analogue signal of the other polarity is required, or alternatively the capacitor may be charged directly to a voltage of the required polarity. In the latter case it is arranged that the direction of flow of the said combined current used to charge the capacitor is reversible.

In one embodiment of the invention the portion of a received code which indicates whereabouts on a particular sigment the analogue signal lies is compared with the contents of a digital counter, the count of the counter being delayed by an amount equal to the time taken for the linearly increasing signal to increase to the lowest value associated with the said particular one of the straight-line segments, so that the count of the counter starts from zero only when the linearly increasing signal has reached the said lowest value.

Where the said particular one of the straight-line segments is the first or lowest value segment, the delay will be zero, (neglecting the constant one-half bit delay referred to later)

In another embodiment of the invention the portion of a received code which indicates whereabouts on a particular segment the analogue signal lies is compared with the contents of a digital counter, the start of the comparison being delayed by an amount equal to the time taken for the linearly increasing signal to increase to the lowest value associated with the said particular one of the straight-line segments so so that the comparison process starts only when the linearly increasing signal has reached the said lowest value.

Figure 2:
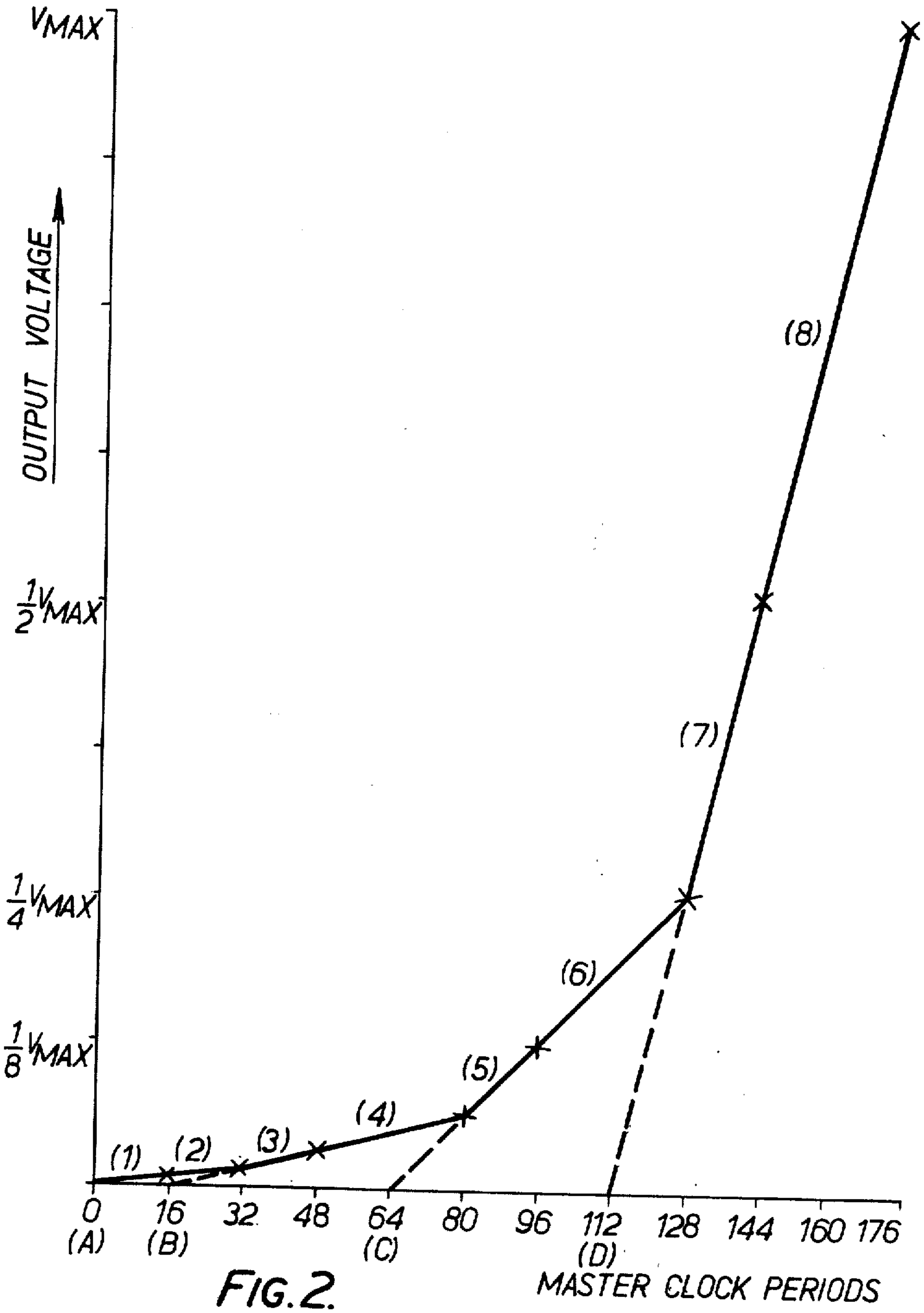
Figure 3:
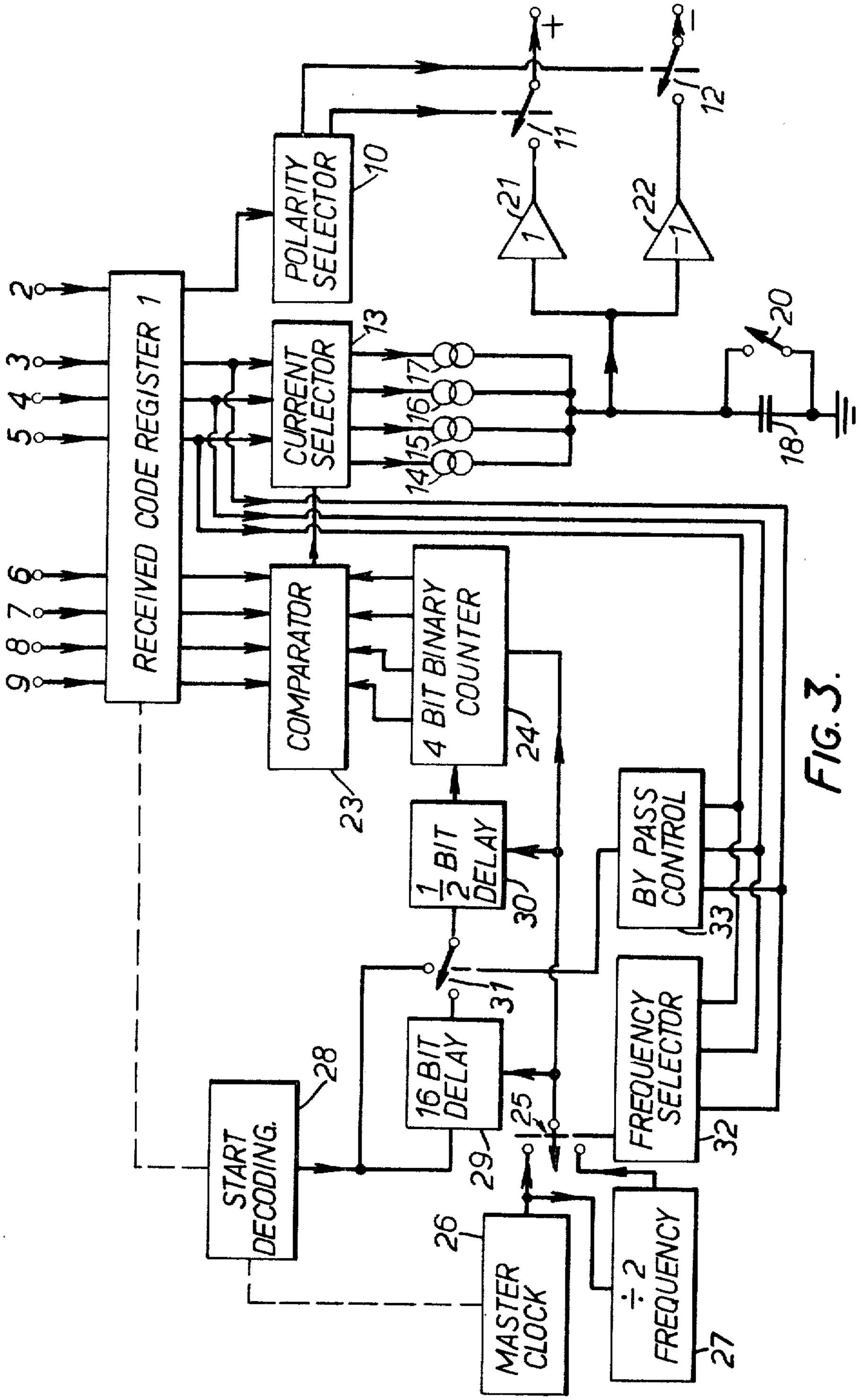
Figure 4:
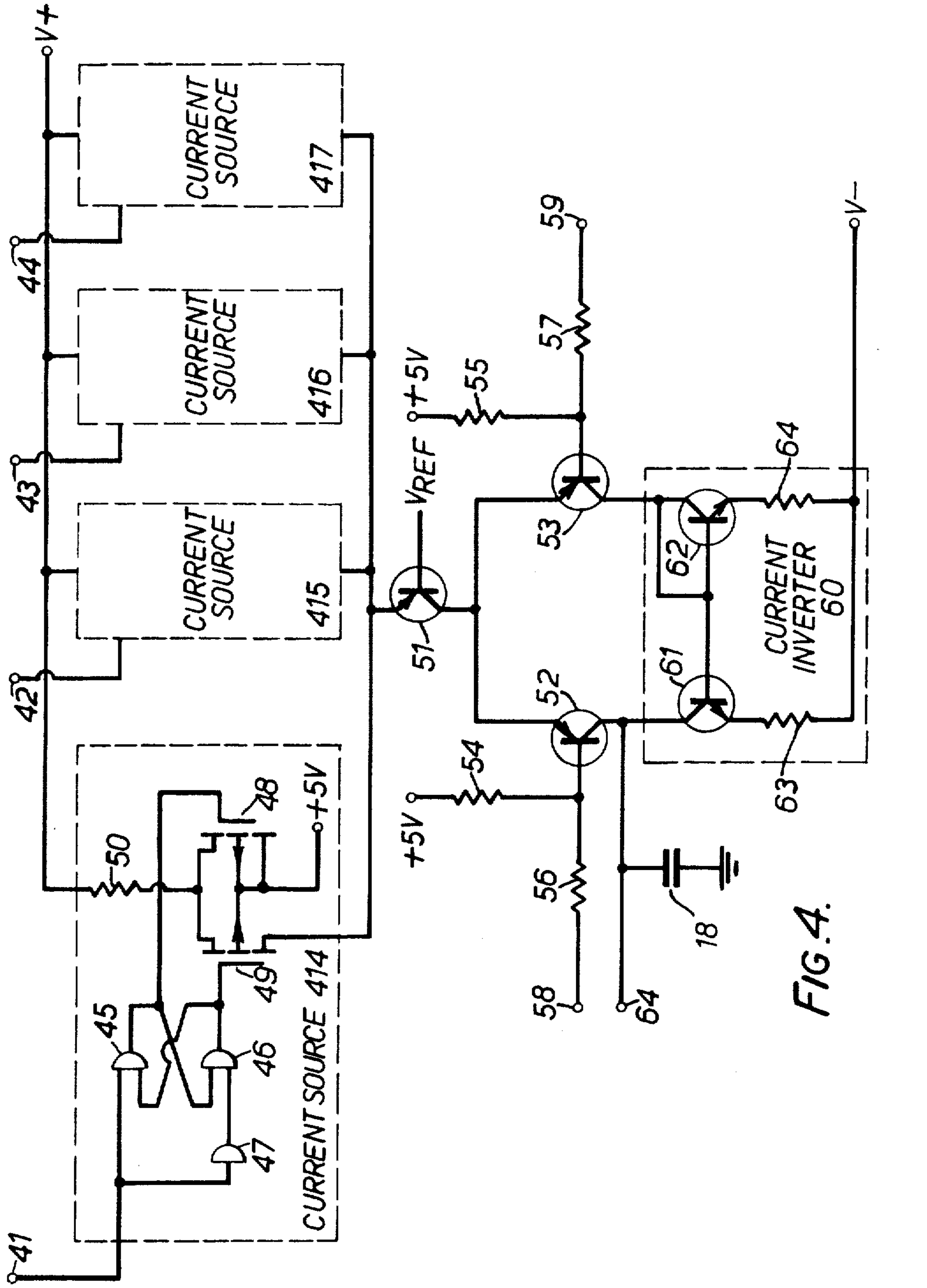
Figure 5:
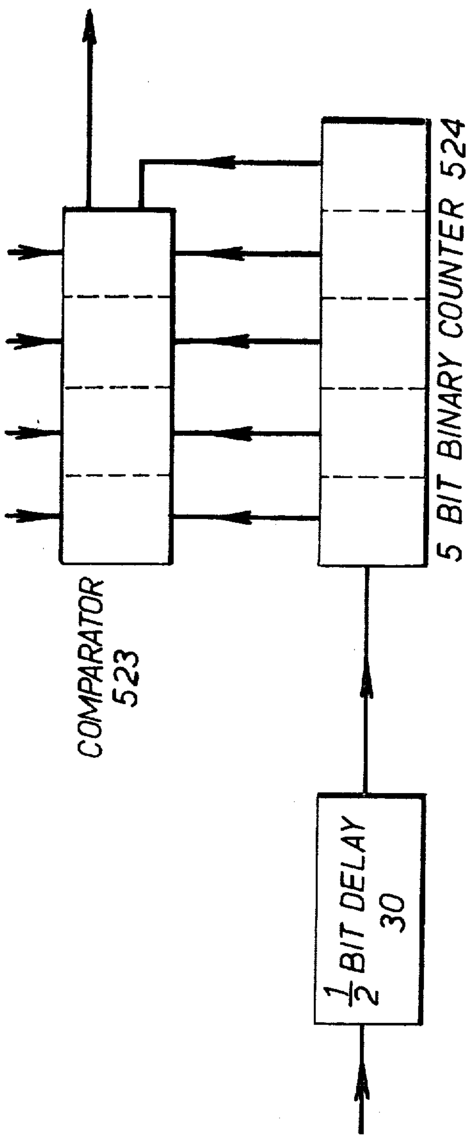

The invention will be further described, by way of example with reference to the accompanying drawings in which FIG. 1 shows a representation of the positive half of a companding law, FIG. 2 is an explanatory diagram, FIG. 3 shows one embodiment of a digital to analogue converter in accoreance with the present invention and FIGS. 4 and 5 shows modifications thereof.

Referring to FIG. 1 there is shown therein a representation of a companding law as mentioned previously. The voltage Vmax is the maximum output available, and the solid-line curve shows the relationship between various fractions of Vmax and different values of a binary code, only those discrete values of the output voltage corresponding to a code being obtainable. The binary code shown has eight digits, the first digit indicating the polarity, the next three digits identifying a particular one of the straight-line segments 1 . . . . 8 of the curve and the last four digits identifying the particular voltage level (i.e. quantum level) on that segment. As is often the case, the first two segments have identical gradients, and for the succeeding segments the gradients increase in geometric progression, i.e. the gradient of segment 3 is twice that of segment 2, the gradient of segment 4 is twice that of segment 3, and so on. The use of four digits to identify a particular voltage level on a segment allows the use of 16 discrete levels or quantum steps on each segment. It will be noted that the magnitude of each quantum step is related to the gradient of the segment in which it occurs.

Referring now to FIG. 2 there is shown therein an explanatory diagram which is essentially a companding law in which the fractions of Vmax have been plotted against units of time, the units of time representing the clock periods of a master oscillator. It will be noted that the curve of FIG. 2 contains fewer segments having different gradients than did the companding law curve of FIG. 1. This is because the rate at which the analogue voltage level increases may be controlled in two separate ways; this will become apparent from the description of the operation of the converter shown in FIG. 3. Briefly, however, as has been stated, the analogue voltage level is increased until that level corresponding to a particular digital code is reached. The voltage level may be increased at a constant rate whilst increasing the time interval between code levels in successive segments to produce the companding law curve, or alternatively the time interval between code levels could remain constant, and the slope of the voltage ramp increased. In fact to obtain economy and simplicity of circuitry a combination of these two methods is used.

Referring to FIG. 3, a received code register 1 having eight input terminals 2 to 9 to which in practice an eight bit binary code is applied, is provided with eight outputs, each one corresponding with one bit of the binary code. A single serial input may be provided in place of the eight parallel inputs if desired. As drawn the most significant bit of the binary code is stored at the right-hand end of the register, and the least significant bit at the left-hand end. The most significant bit position is connected to a polarity selector 10, having two outputs each connected respectively to a switch 11 and a switch 12. The next three most significant bit positions (the bits stored in these positions determine the segment of the companding law) are connected to a current selector 13 which controls four constant-current generators 14, 15, 16, and 17 which are all connected to a capacitor 18, one side of which is earthed. The capacitor 18 is provided with a short-circuit switch 20. The four constant current generators are also connected to a pair of amplifiers 21 and 22; amplifier 21 having a gain of unity and being connected to switch 11, and amplifier 22 having a gain of minus unity (i.e. it provides a polarity reversal) and being connected to switch 12. The last four bit positions (the least significant bit positions) are connected to a four bit digital comparator 23, to which is also connected a four-bit binary counter 24. The counter 24 is connected, via one contact of a frequency selector switch 25 to a master clock 26; a divide-by-two frequency divider 27 is connected between the master clock 26 and another contact of the frequency selector switch 25. The counter 24 is controlled by a start decoding circuit 28 via a 16-bit delay 29 and a half-bit delay 30. The 16-bit delay is provided with a by-pass switch 31.

The frequency selector switch 25 and the bypass switch 31 are controlled by a frequency selector 32 and a by-pass control 33 respectively, both the frequency selector 32 and the by-pass control 33 being connected to the three bit position of the register 1 which determine the segment of the companding law curve.

The operation of the circuit will be explained with further reference to FIGS. 1 and 2. The solid-line curve of FIG. 2 is made up of four striaght lines and these correspond to currents I1 to I4 from current generators 14 to 17 respectively. it is arranged that I2 = 2I1, I3 = 8I1 and I4 = 32I1. For segments 4, 6 and 8 the count rate is halved so that the output voltage changes by twice as much, while the counter goes through 16 states, as it did for segments 3, 5 and 7 respectively. since it is known from the recieved binary code on which of the four slopes or segments the final voltage lies it is arranged that the output voltage starts from one of points A, B, C, or D and moves up a single straight line. In this way any quantum level in any segment can be reached with 64 clock periods of the master clock, as opposed to 176 possible clock periods for previously known converters. (These figures ignore the one-half bit delay produced by delay 30). It is clear from FIG. 2 that with the exception of the first slope 16 master clock periods will elapse before the voltage level meets the solid curve. Thus if a code is received (assumed not segment 1 or 2) the segment code selects a slope by producing a particular constant current by means of the current selector 13 and 16 clock pulses (at master clock frequency for segments 3, 5 and 7 and at divided-by-two master frequency for segments 4, 6 and 8) would take the output voltage to the beginning of the required segment. If the desired code level is in the lower of the two segments the master clock frequency is used, whereas if the upper segment is required the clock frequency divided by two is used.

The half-bit delay 30 is present to minimise errors introduced by the quantisation of the encoding process.

The following table gives the number of cycles required of the master clock to reach the $x$'th quantum level of a particular segment.

| Segment | Segment Code | Current | Cycles Required |
|---|---|---|---|
| 1 | 000 | I1 | x + ½ |
| 2 | 001 | I1 | 16 + x + ½ |
| 3 | 010 | I2 | 16 + x + ½ |
| 4 | 011 | I2 | 2 (16 + x + ½) |
| 5 | 100 | I3 | 16 + x + ½ |
| 6 | 101 | I3 | 2 (16 + x + ½) |
| 7 | 110 | I4 | 16 + x + ½ |
| 8 | 111 | I4 | 2 (16 + x + ½) |

Thus the segments 4, 6 and 8 are produced by 16 + x + ½ cycles of the divided-by-two clock frequency.

One example of the operation of the converter of FIG. 3 is as follows. Assume that binary code 11010001 is received by the register 1. The most significant bit is 1 and this is detected by the polarity detector 10 which closes switch 11 and opens switch 12 so that a positive voltage output is obtained. The segment code is 101 and this is detected by the current selector 13 as requiring a current of 13 which therefore turns on current generator 16.

since segment code 101 represents segment 6 it is necessary to switch in the divide-by-two frequency divider 27. The frequency selector 32 therefore detects the code 101 and operates switch 25. Since the starting point for the counter 24 is point C on FIG. 2 a 16-bit delay is required and consequently the by-pass control 33 is arranged to detect the code 101 and to connect switch 31 to the 16-bit delay 29.

When counting is to commence a synchronising signal is applied to the start-decoding circuit 28 and the master clock 26. The form and origin of the synchronising signal will depend on the system used, but must be produced each time a new binary code is received in the register 1. The synchronising signal paths are shown in broken line. The current selector 13 must also be synchronised with the start-decoding circuit 28.

After a total delay of 16 + ½ cycles at half the master clock frequency the 4-bit counter 24 starts to count. At this point in time the output of amplifier 21 will be that of the lowest voltage corresponding to segment 6. The quantum level on segment 6 is given by the four least significant bits, i.e. 0001, and after a single further count of counter 24 this condition is reached and the comparator 23 provides a signal which stops the current generator 16, and the output voltage remains constant. After the capacitor 18 is discharged by closing switch 20 the whole process is repeated when the next binary code is received.

As will now be appreciated by means of this invention the maximum time taken to effect a digital-to-analogue conversion will be 64 clock periods of the master clock (65 periods allowing for the half bit delay 30), as opposed to 176 clock periods with the known converter. This provides a significant saving of time, enables a higher data rate to be used, and reduces the deleterious effects which may result from undesired discharge from the capacitor occurring in the interval before the voltage on the capacitor is utilised. It will be appreciated that for segments 3, 5 and 7 the time taken to reach the upper end of the segments will be 32 clock periods of the master clock.

Referring to FIG. 4 there is shown therein a modification of the decoder illustrated in FIG. 3. Instead of arranging that the polarity detector 10 switches in one of the two amplifiers 21 or 22 in dependence on the signal polarity, it is arranged that the storage capacitor is charged with the correct polarity charge directly.

Four current sources are provided and are shown referenced 414, 415, 416 and 417. The current sources are provided with control leads 41 and 44 respectively which are fed by signals produced from the current selector 13 of FIG. 3. Each current source includes a pair of cross-coupled dual-input NAND gate 45, 46, one input of gate 45 being connected to its respective one of control leads 41 to 44 directly, and one input of gate 46 being similarly connected via an inverter 47. The output of gate 45 is connected to the gate electrode of a field effect transistor 48, the drain of which is connected to its substrate and to a +5 volt supply. The source of transistor 48 is connected via a resistor 50 to a source of positive voltage V+. The output of gate 46 is connected to the gate electrode of a field effect transistor 49, the drain of which provides a constant current output. The substrate and source of transistor 49 are connected respectively to the substrate and source of transistor 48. Transistors 48 and 49 preferably have matched electrical characteristics.

The current sources 415, 416 and 417 are each the same as current source 414.

The outputs of the four current sources 414, 415, 416 and 417 are connected together and to the emitter of a p.n.p. bipolar transistor 51, the base of which is connected to a reference voltage Vref, and the collector of which is connected to the emitters of a pair of further p.n.p. bipolar transistors 52 and 53. The base connections of transistors 52 and 53 are connected via respective resistances 54 and 55 to a supply voltage of +5 volts, and via resistors 56 and 57 to terminals 58 and 59. These two terminals would be connected to the outputs of the polarity selector 10 of FIG. 4. The collector of transistor 52 is connected to capacitor 18, and to a current inverter 60 shown within the broken line. The current inverter 60 contains a pair of n.p.n. bipolar transistors 61 and 62, the bases of which are connected together and to the collector of transistor 62. The emitters of transistors 61 and 62 are each connected via a resistor 63 and 64 to a negative voltage supply V−.

Considering current source 414, if a logical 0 level is applied to lead 41, transistor 48 is turned into non-conductive state and transistor 49 becomes conductive connecting the current path through resistor 50 to transistor 51 which acts as a current source. If several of current sources 414, 415, 416 and 417 are turned on transistor 51 provides a current which is the sum of the separate currents. Transistors 52 and 53 are used to alter at will the polarity of the voltage to which capacitor 18 is charged. When a logical 0 level is applied to terminal 58, transistor 52 becomes conductive and acts as a unity gain current amplifier to charge capacitor 18 positively. It is arranged that transistors 52 and 53 at no time both conduct simultaneously. When a logical 0 level is applied to terminal 59, transistor 53 conducts and the current applied to transistor 62 flows through this transistor to resistor 64, forcing the base of transistor 62 to adopt a potential consistent with the current flowing through the transistor. Transistors 61 and 62 are a matched pair, and consequently the potential at the base of transistor 61 causes this transistor to pass the same current as transistor 62. The current through transistor 61 is drawn off the capacitor 18, since transistor 52 is non-conductive, thus producing a negitive output. The output from capacitor 18 is taken off via terminal 64 and represents the required analogue signal.

A further modification to the decoder illustrated in FIG. 3 is shown in FIG. 5. In this modification the 16-bit delay 29 of FIG. 3 is dispensed with, and clock pulses are applied directly via the one-half-bit delay 30 to a 5-bit binary counter 524 instead of the 4-bit binary counter 24 as previously. The first four bits of counter 524 are connected to a comparator 523 in exactly the same way as counter 24 was connected to the comparator 23. However comparator 523 is provided with an enable input which is connected to the fifth bit of the 5-bit binary counter 524. For a one-half-bit delay the comparator is enabled half a cycle after the currents start. Otherwise it is enabled 16 ½ cycles after the current starts when the fifth bit of counter 524 becomes a logical 1 level.

I claim:

1. A digital-to analogue converter comprising, in combination:

storage means for storing successive digital codes during conversion thereof to corresponding analogue signals, each of said codes including certain bits identifying a straight line segment of a conversion law obeyed by the converter and other bits providing a digital number identifying whereabouts on said segment the corresponding analogue signal lies, at least two of said segments defining a straight line section having a predetermined positive slope starting from a finite minimum value of said corresponding analogue signal and which defines the beginning point of one line segment;

means responsive to said certain bits identifying either said two segments for producing a linearly increasing signal whose rate of increase corresponds to said predetermined slope whereby said signal reaches the level of said beginning point of said one line segment after a predetermined period of time;

counter means for counting clock signals to produce an increasing digital output number;

first clock signal means for producing a first clock signal of a frequency corresponding to m clock pulses during said predetermined period of time;

said one line segment having an end point which is reached by said linearly increasing signal after $m = k$ of said first clock pulses where $k$ is the number of said first clock pulses required for said linearly increasing signal to increase from said minimum value to said end point;

second clock signal means for producing a second clock signal of a frequency corresponding to m second clock pulses during the time taken for said linearly increasing signal to reach said end point of said one line segment;

delay means for driving said counter means after m pulse inputs thereto;

comparator means for comparing the output of said counter means with the number represented by said other bits of a stored code;

switch means responsive to said certain bits of a stored code for connecting one of said clock signals to said counter means through said delay means; and means for taking off the value of said linearly increasing signal when equality between the count of said counter means and that number represented by said other bits is reached.

2. A digital-to-analogue conterter as defined in claim 1 wherein the frequency of said first clock means is twice that of said second clock means whereby $m = k$ with said one line segment being half the length of the other line segment.

3. A digital-to-analogue converter as defined in claim 2 wherein there are a plurality of consecutive line sections in said conversion law, each defined by a pair of line segments and each consecutive line section having twice the slope of the preceding line section.

* * * * *